United States Patent [19]
Komeno

[11] 4,411,729
[45] Oct. 25, 1983

[54] METHOD FOR A VAPOR PHASE GROWTH OF A COMPOUND SEMICONDUCTOR

[75] Inventor: Junji Komeno, Fujisawa, Japan

[73] Assignee: Fujitsu Limited, Kawasaki, Japan

[21] Appl. No.: 191,296

[22] Filed: Sep. 26, 1980

[30] Foreign Application Priority Data

Sep. 29, 1979 [JP] Japan ............................ 54-124719
Sep. 29, 1979 [JP] Japan ............................ 54-124720

[51] Int. Cl.³ .......................................... C30B 25/18
[52] U.S. Cl. ............................................... 156/612
[58] Field of Search ............................ 156/612–614,
156/610, DIG. 70, DIG. 89; 148/174, 175;
252/62.3 GA; 427/85–87, 248.1, 255.1, 255.2

[56] References Cited
U.S. PATENT DOCUMENTS

| | | | |
|---|---|---|---|
| 3,226,254 | 12/1965 | Reuschel | 427/86 |
| 3,476,592 | 11/1969 | Berkenblit et al. | 156/612 |
| 3,635,771 | 1/1972 | Shaw | 427/255.2 |
| 3,969,163 | 7/1976 | Wakefield | 427/86 |
| 3,997,351 | 12/1976 | Vergano et al. | 427/85 |
| 4,082,865 | 4/1978 | Ban et al. | 427/86 |
| 4,089,735 | 5/1978 | Sussman | 156/612 |
| 4,098,923 | 7/1978 | Alberti et al. | 427/85 |
| 4,179,326 | 12/1979 | Kudo et al. | 156/612 |
| 4,190,015 | 2/1980 | Hillman | 427/85 |
| 4,204,893 | 5/1980 | Cox | 156/612 |

OTHER PUBLICATIONS

Taylor, "The Effect of Substrate Orientation," published in J. of Electrochem. Soc.: Solid State Science, Mar. 1969, pp. 383–388.
Williams, "The Effect of Orientation," published in J. of the Electrochem. Soc., Jul. 1964, 886–888.

*Primary Examiner*—Hiram H. Bernstein
*Attorney, Agent, or Firm*—Staas & Halsey

[57] ABSTRACT

In the vapor phase epitaxy (VPE) method employed for growth of a compound semiconductor, a high resistivity GaAs buffer layer and a low resistivity GaAs active layer are successively grown on a GaAs substrate in a VPE reaction tube. A GaAs substrate having a crystallographic orientation different from that of the GaAs substrate is positioned just above and opposite to the GaAs substrate, thereby decreasing the epitaxial growth rate and impurities in the epitaxial buffer layer grown on the GaAs substrate. To grow the low resistivity active layer, the dummy substrate is moved away from the GaAs substrate downstream from the gas flow direction. This method provides for a low impurity concentration in the buffer layer and a steep doping distribution between the grown epitaxial layers. Advantageously, the yield of the VPE method is enhanced and the noise figure of FETs produced by this VPE method is decreased.

20 Claims, 11 Drawing Figures

METHOD FOR A VAPOR PHASE GROWTH OF A COMPOUND SEMICONDUCTOR

BACKGROUND OF THE INVENTION

The present invention relates to a vapor phase growth of a compound semiconductor and more particularly to the vapor phase growth, by which an epitaxial layer having a high resistivity of, for example, 100,000 ohm-cm or higher, can be produced stably having a good reproducibility. The present invention is also related to a vapor phase growth of semiconductor layers having an interface, at which the distribution profile of the impurity concentration is abruptly changed.

Such semiconductor devices using the III-V group compounds, e.g., GaAs, as a field effect transistor, have conventionally been produced by a vapor phase epitaxy (VPE) of an active layer having a submicron thickness on a semi-insulating crystalline GaAs substrate. It has, however, been impossible to avoid the problem that the crystal defects, i.e., crystallographic defects such as lattice defects and dislocations, of the semi-insulating substrate extend to the active layer during the crystal growth and cause modification of electric properties of the active layer which grows on the substrate. This problem degrades the properties, especially the output and the efficiency, of the semiconductor devices. In order to overcome this problem, a buffer layer having a high resistivity is usually located between the semi-insulating crystalline substrate and the active layer, so as to exclude the influence of the substrate on the active layer.

In the VPE method employed for the growth of the compound semiconductors, a reaction chamber is provided with high- and low-temperature regions forming a temperature distribution between these regions. Gallium, which is a source material, and arsenic trichloride, which is a reaction gas, are brought into a disproportionation reaction at the high temperature region, and the product of the reaction, which is growth gas, is brought into contact with a crystalline substrate positioned at the low temperature region downstream of the gallium thereby growing a crystal on the substrate.

Compound semiconductor devices with a buffer layer and an active layer have been produced by means of the VPE process explained above. A high resistivity first epitaxial layer as the buffer layer and then a highly doped second epitaxial layer as an active layer on the crystalline substrate are continuously grown. When this continuous growth, namely a multilayer VPE, is repeated in individual reaction chambers, the impurities of a high concentration, which are introduced into the reaction chambers at the growth stage of the active layer, contaminate the wall of the reaction chamber, the source material and the like, and therefore, it becomes difficult to obtain the buffer layer having a high resistivity. This is a major reason for the low yield of the conventional multi-layer VPE.

In the production of the compound semiconductor devices having a buffer layer, the impurity concentration in the growth gas is changed from a low value for growth of a high resistivity layer to the low value for the growth of the low resistivity layer, which change however does not occur instantaneously but with a lapse of time ranging from a few tenth of a second to a few minutes.

Therefore, a considerably wide distribution of impurities at the interface between both layers is inevitably formed. The gradient of the so formed distribution of the impurities is small, with the consequence that, generally speaking, the characteristics of the semiconductor devices deteriorate, especially the noise figure.

In order to obtain a steep gradient of the concentration distribution, various methods including a method of etching a crystal by an HCl gas during the growth of the crystal until the equilibrium of the impurity concentration was reached, were tested. According to the most successful method, the grown layer thickness required for changing the carrier concentration from $10^{16}/cm^3$ to $10^{15}/cm^3$ was approximately 1800 Å (18 nm) and the grown layer thickness required for changing the carrier concentration of from $10^{17}/cm^3$ to $10^{15}/cm^3$ was slightly less than 2500 Å (25 nm).

SUMMARY OF THE INVENTION

It is an object of the present invention to eliminate the disadvantages of the conventional methods and to provide a method which makes it possible to stably carry out a multi-layer VPE of layers having a different impurity concentration from each other.

It is another object of the present invention to provide a multi-layer VPE method, which is repeated, in which the influences of the impurities having a high concentration and being introduced into the VPE reaction chamber during the growth of a low resistivity active layer are excluded. Thus a high resistivity buffer layer can be grown stably with good reproducibility.

It is a further object of the present invention to provide a vapor phase growth method, in which the gradient of impurity distribution at the interface of the compound semiconductor layers can be enhanced much more than in the conventional methods.

It is also an object of the present invention to provide a vapor phase growth method of compound semiconductor crystals, due to which the recovery or yield of multi-layer VPE can be largely enhanced.

A semiconductor crystalline substrate indicated by a crystallographic plane index hereinbelow should be construed to mean that the substrate has a predominant or major crystal surface expressed by such crystallographic plane index.

The basic concept of the present invention involves a discovery that incorporation of impurities into an epitaxial layer growing on a compound semiconductor substrate is reduced by another substrate having a crystallographic orientation different from such orientation of and located just above the compound semiconductor substrate.

The other substrate mentioned above will be hereinafter referred to as the dummy substrate.

One of the processes of the present invention is related to a vapor phase method of growing a compound semiconductor, particularly a III-V group compound semiconductor on a semiconductor crystalline substrate, and is characterized by conducting the vapor phase growth while positioning another crystalline substrate (dummy substrate) opposite to the semiconductor crystalline substrate, the dummy substrate having a crystallographic orientation different from that of the semiconductor crystalline substrate.

Another process of the present invention is related to a vapor phase method of growing a III-V group compound semiconductor on a semiconductor crystalline substrate and is characterized in that the vapor phase growth is conducted while another crystalline substrate (a dummy substrate) is positioned just above and opposite to said semiconductor crystalline substrate, and, further the dummy substrate is moved during the crystal growth in the gas flow direction to a downstream position.

In an embodiment of the present invention, not less than two layers of III-V group compound semiconductors having different impurity concentrations from each other are grown on a semiconductor crystalline substrate and the dummy substrate is positioned just above and opposite to said semiconductor crystalline substrate during the growth of a low impurity concentration layer or layers.

In a further embodiment of the present invention, not less than two III-V group compound semiconductor layers having different impurity concentrations from each other are grown on a semiconductor crystalline substrate and while the dummy substrate is moved in the gas flow direction to a downstream position there is a growth of a high impurity concentration layer or layers. The downstream movement of the dummy substrate is conducted when the flow of a gas for the growth of the high impurity concentration layer or layers is stabilized in the gas phase growth reaction chamber subsequent to switching of the growth gases from a low to high impurity concentration. When the growth of the high impurity concentration layer mentioned above is to be followed by the growth of a low impurity concentration layer, the dummy substrate is moved upstream against the gas flow direction. Movement of the dummy substrate over the semiconductor substrate reduces the impurity concentration in the grown layer.

The crystal of the objective substrate, on which the desired epitaxial layer is to be formed, is not restricted to, but is preferably of the same kind as, the crystal of the dummy substrate, for example GaAs for both substrates. The objective substrate is hereinafter referred to as the VPE substrate. When the crystal of the VPE substrate is (100), the crystal of the dummy substrate should be (110), (111)A or (111)B. When the former crystal is (110), the latter crystal should be (111)A or (111)B. When the former crystal is (111)B, the latter crystal should be (111)A. The (111)A is distinguished from (111)B in a general sense, namely that in the case of GaAs, the A and B planes indicate the Ga and As planes, respectively. In the combinations of the crystallographic orientations mentioned above, the combination of the (100) VPE substrate with the (111)A dummy substrate is preferable. The crystallographic orientations of the substrate mentioned above, for example (100), should not be restrictively construed to be exactly (100) but be broadly construed to include an off angle which is usually employed for the vapor phase growth of compound semiconductors. Similarly, a deviation of the dummy substrate from a crystallographic orientation is permitted, and, for example, a dummy substrate approximately 5° from the (111)A is similarly effective as in the (111)A dummy substrate for the removal of influences of impurities upon the growth.

In general, the gap between the VPE substrate and the dummy substrate should be less than 20 mm, when the dummy substrate is positioned just above the VPE substrate, to contribute to the formation of a low impurity concentration or high resistivity VPE layer on the VPE substrate.

BRIEF DESCRIPTION OF THE DRAWINGS

The present invention is explained hereinafter with reference to the drawings, wherein.

DESCRIPTION OF THE PREFERRED EMBODIMENTS

Figure 1:
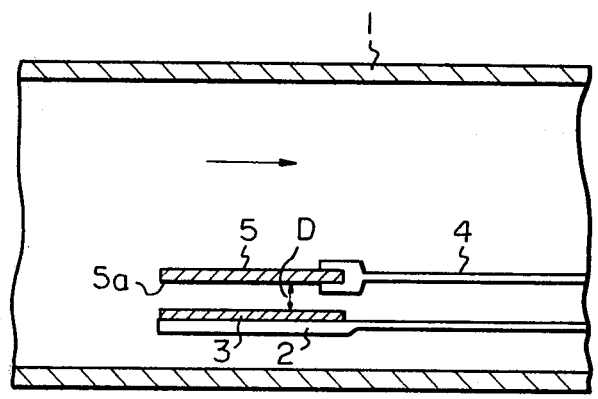
FIG. 1 is a schematic diagram of the basic arrangement used for the growth of GaAs VPE layers.

Referring to FIG. 1 showing a partial longitudinal cross sectional view of a vapor phase growth assembly, a carrier gas, i.e. nitrogen ($N_2$) or hydrogen ($H_2$), is passed in a quartz reaction tube 1 in the direction of the arrow. The carrier gas carries reaction gas for VPE growth of a semiconductor layer and predetermined dopant (i.e., impurities). A VPE substrate 3, for example a GaAs substrate having a major or predominant surface of (100), is placed on an appropriate holder 2 and the objective of the vapor phase growth is to grow a semiconductor layer on the VPE substrate 3. A dummy substrate 5 held by an appropriate holder 4 is disposed opposite to and just above the VPE substrate 3. The crystallographic orientation of the dummy substrate 5 opposite to the VPE substrate 3 is so selected that the surface 5a of dummy substrate is, for example, (111)A. The dummy substrate 5 has the same size as the VPE substrate 3 and, although not shown in FIG. 1, covers the VPE substrate 3 in a planar relationship. The dummy substrate 5 may, however, be greater than the VPE substrate 3, which is the objective of the growth. Both substrates 3 and 5 are arranged parallel to each other in FIG. 1 but it is possible to have another arrangement in which one or both of the substrates are inclined toward a horizontal line. The gap D between both substrates 3 and 5 is preferably approximately 7 mm in the case of a 4 cm inner diameter of a quartz reaction tube 1, but the gap is not strictly related to the inner diameter of the quartz reaction tube.

Experiments of growth of GaAs using the assembly explained hereinabove are now explained.

A nitrogen carrier gas was passed through a purifier, thereby decreasing oxygen and water in the carrier gas to levels less than 0.1 and 1 ppm, respectively.

The nitrogen carrier gas, in contact with a gallium source material upstream of the VPE substrate in the reaction tube, was passed through a doping tube, an AsCl$_3$ bubbler, and a bypass tube at rates controlled to 35, 300, and 700 cm$^3$/min, respectively.

The AsCl$_3$ bubbler contained AsCl$_3$ having a purity of 99.9999% and was controlled at 26° C., while the doping tube contained elemental sulfur as an n-type dopant and its temperature was controlled in the range of 42 to 72° C.

VPE substrate materials used were either chromium doped semi-insulating GaAs or tellurium doped N$^+$GaAs, oriented 5° off the (100) towards the (1,0). Chromium doped semi-insulating (111)A, (111)B, (110), and (100) GaAs oriented exactly to the Miller indexes were used as dummy substrates. The VPE substrates were chemicaly etched using an 18:1:1 H$_2$SO$_4$:H$_2$O$_2$:H$_2$O solution at room temperature prior to epitaxial growth.

The temperature for the gallium source material in the upstream region for this VPE process was 800° C. The growth temperature for the VPE substrate in the reaction tube was held at 700° C. FIGS. 2-7 of the drawings illustrate various relationships and results relating to these VPE experiments.

Figure 2:
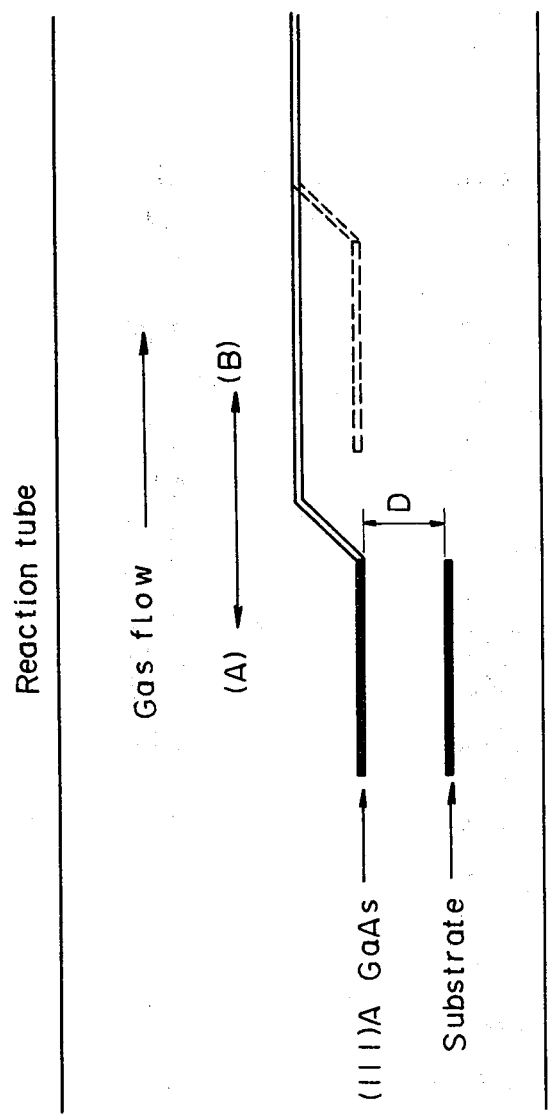
FIG. 2 is a schematic diagram of movement of a dummy substrate.

FIG. 2 illustrates the positions of the substrates used for the growth of GaAs VPE layers. The VPE substrate indicated by "Substrate" is held at a fixed position while the dummy substrate indicated by "(111)A GaAs" is moved in the gas flow direction from a position just above the VPE substrate (a working position A) to a downstream position B, or against the gas flow direction from the downstream position B to the working position A.

It was found in the experiments of the present inventor that positioned the dummy substrate at the working position A reduces the incorporation of sulfur (doping impurities) into the GaAs VPE layers growing on the VPE substrate. Consequently, the carrier (impurity) concentration of the epitaxial layers grown by using the dummy substrate placed at the working position A is lower than that of the epitaxial layer grown at position B of the dummy substrate and, simple moving of the dummy substrate from the downstream position B to the working position A achieves a steplike doping profile of high (N$_H$) and low (N$_L$) doped epitaxial layers.

Figure 3:
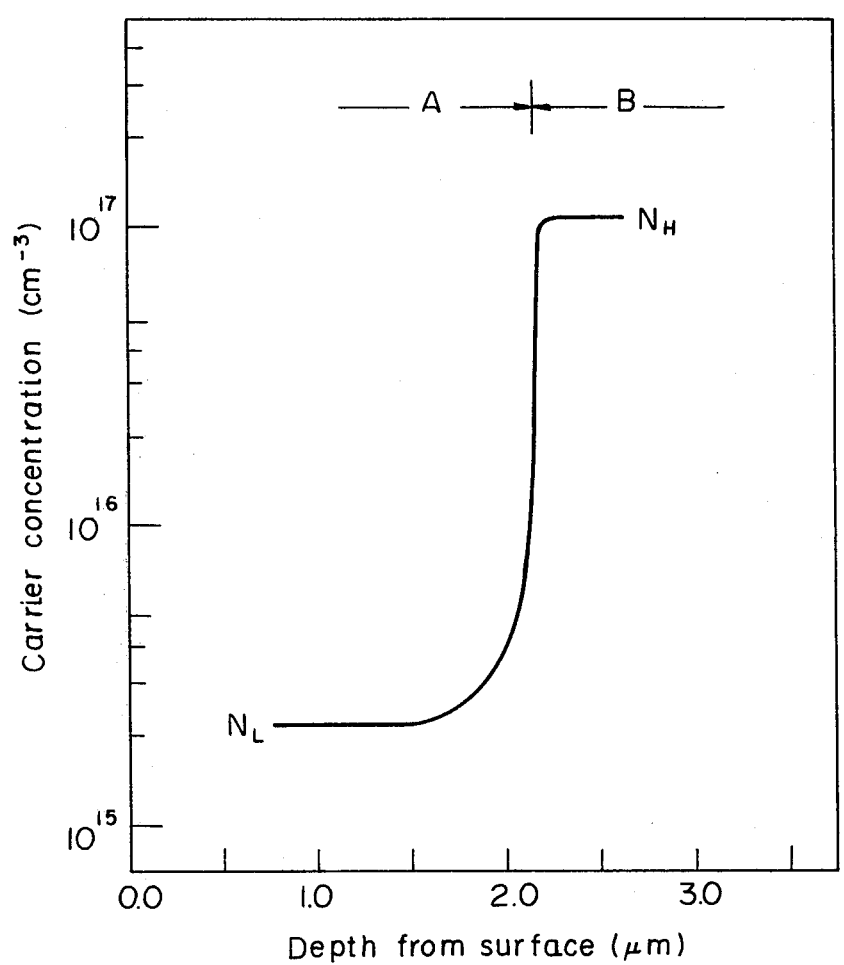
FIG. 3 is a steplike doping profile of a GaAs VPE layer grown with use of a (111)A VPE GaAs dummy substrate.

FIG. 3 shows an example of the steplike doping profile of an epitaxial layer grown on the VPE substrate having a major surface oriented 5° off the (100), under the condition of the (111)A GaAs dummy substrate and the gap D of 7 mm. When the growth at the working position A is utilized for the vapor phase growth of high resistivity buffer layers following the vapor phase growth of low resistivity active layers, the buffer layers stably exhibit high value resistivity, nothwithstanding the previous high impurity concentration used for the active layers.

Figure 4:
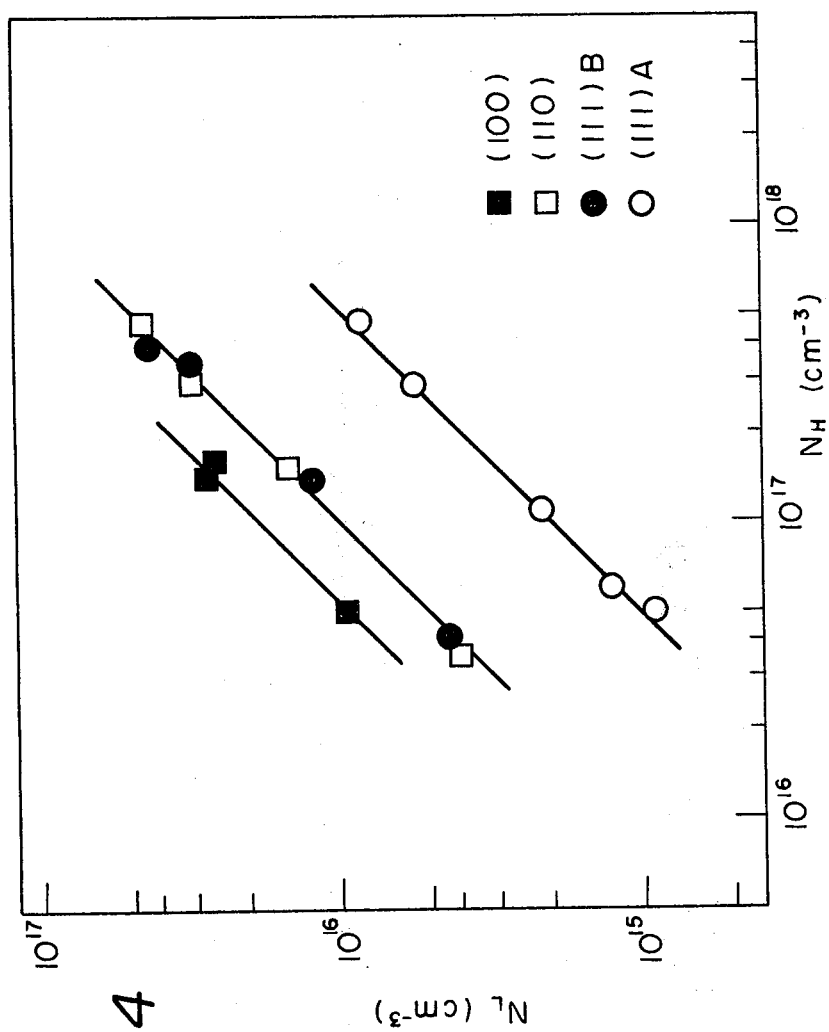
FIG. 4 is a graph of the relationship between high and low carrier concentrations $N_H$ and $N_L$, respectively, of GaAs VPE layers.

Referring to FIG. 4, the relationship between the carrier concentrations of low (N$_L$) and high (N$_H$) doped GaAs VPE layers is illustrated. These layers were grown on the 5° off (100) oriented VPE substrate at several sulfur temperatures using the (111)A GaAs dummy substrate, with the gap D being 7 mm. Also illustrated in FIG. 4 are the results when in addition to (111)A GaAs the (111)B, (110), or (100) oriented GaAs dummy substrates are used. It was found that the low-high ratio defined hereinbelow varies with the surface orientation of dummy substrates being placed at the working position A. It was also found that the low-high ratio is independent of the sulfur temperature and that there is a good linear relationship between the carrier concentrations of low and high doped layers. The low-high ratio (N$_L$/N$_H$) can be expressed as $$N_L/N_H = k, \qquad (1)$$

where N$_L$ and N$_H$ are the carrier concentrations of low and high doped layers, respectively. The low-high ratio k was found to be about 0.02, 0.1, 0.1, and 0.2 for the (111)A, (111)B, (110), and (100) GaAs dummy substrates, respectively, when D=7 mm.

The dependence of the low-high ratio k on the gap D was investigated using the (111)A, (111)B, (110), or (100) GaAs dummy substrates. The inner diameter of the quartz reaction tube was 4 cm.

Figure 5:
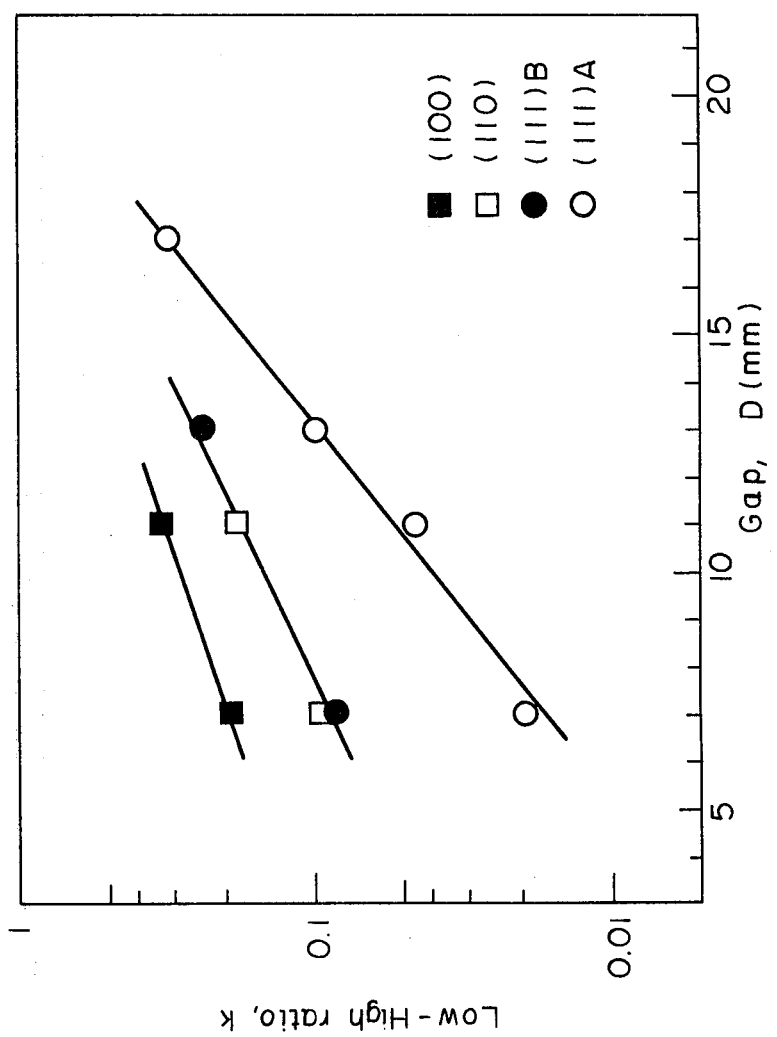
FIG. 5 is a graph illustrating a dependence of a low-high ratio k on the gap D between the dummy substrate and the VPE substrate.

FIG. 5 shows the low-high ratio k obtained as a result of the experiment as a function of the gap D. As can be seen in FIG. 5, the low-high ratio k is strongly influenced by the gap D. The low-high ratio k decreases as the gap D is decreased. In the case of (111)A GaAs dummy substrate the low-high ratio drastically decreases with decreasing gap D and has a value of about 0.02 at D=7 mm. When the gap is from 7 to 10 mm, the obtained low-high ratio k is satisfactorily low.

As seen in FIG. 5, the gap should be less than 20 mm to obtain the influence by the dummy substrate on the impurity concentration of the GaAs VPE layer.

Figure 6:
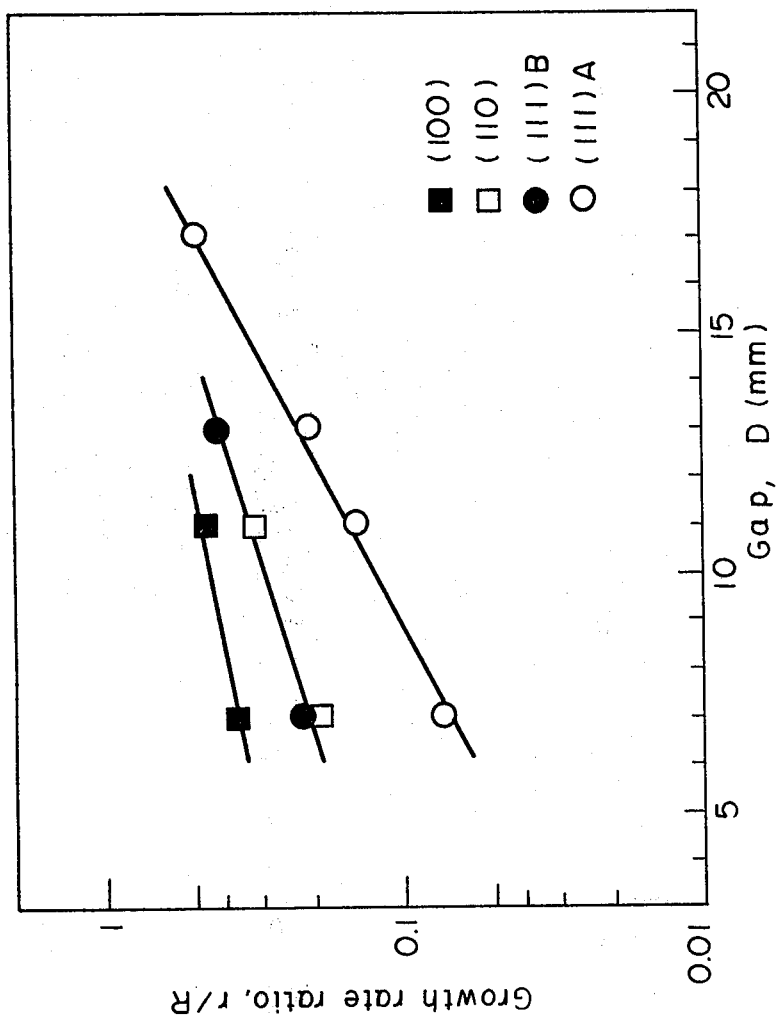
FIG. 6 is a graph illustrating dependence of a growth rate ratio r/R on the gap D.

FIG. 6 shows the gap D dependence of the growth rate ratio r/R obtained by the experiment, where r and R are growth rates of the GaAs VPE layers with use of the (111)A, (111)B, (110), or (100) GaAs dummy substrates being at the working position A and the downstream position B, respectively. As seen in FIG. 6, the growth rate ratio decreases as the gap is decreased, and the growth rate on the VPE (100) substrate varies with the surface orientation of the GaAs dummy substrate at the working position A. This orientation dependence implies that the drastic decrease in growth rate with the (111)A GaAs dummy substrate at the working position A is not mainly due to the reduction of gaseous species caused by changes in the flow pattern resulting from placing the GaAs dummy substrate above the VPE (100) substrate. The growth rate ratio r/R decreases by more than one order of magnitude with decreasing gap D when the (111)A GaAs dummy substrate is used. In this case the growth rates on the (111)A GaAs dummy substrate at the working position A were 5.1~5.5 times greater than that on the VPE (100) substrates.

Figure 7:
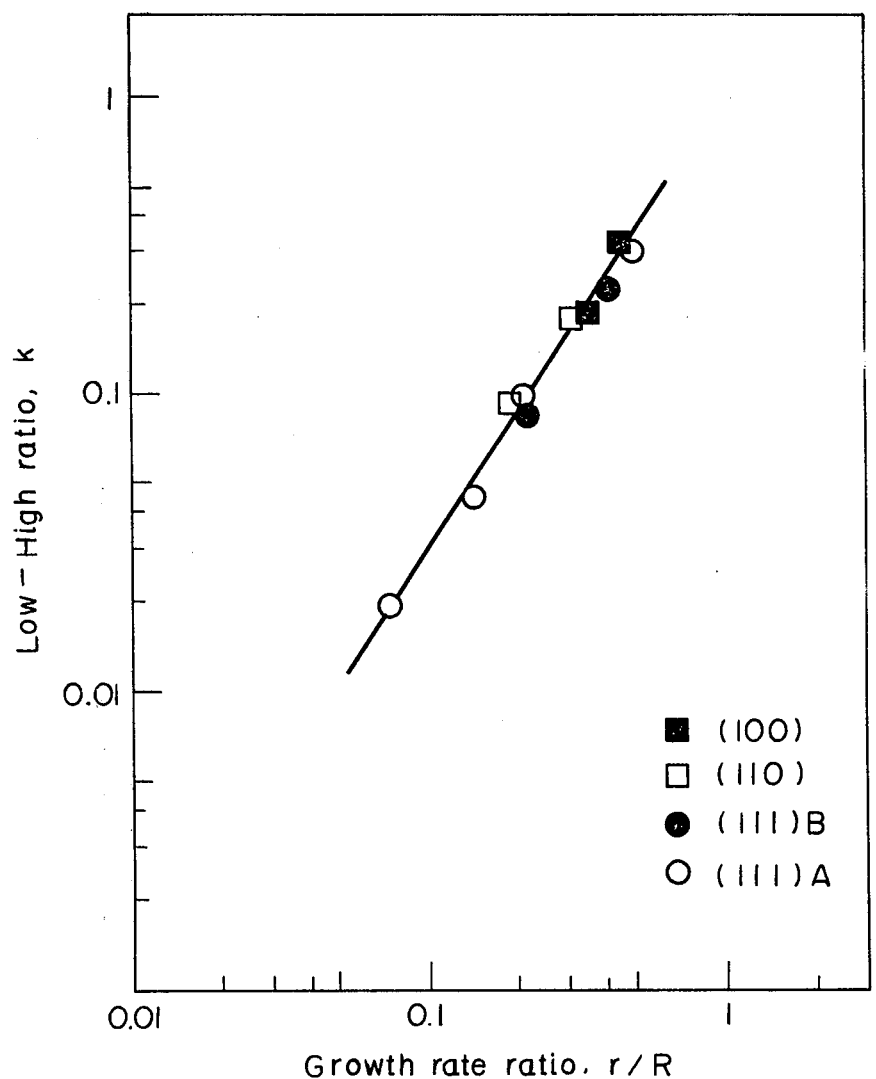
FIG. 7 is a graph illustrating the low-high ratio k as a function of growth rate ratio r/R.

Since the low-high ratio and growth rate ratio r/R are dependent on the gap D, the low-high ratio k can be plotted as a function of growth rate ratio r/R. This is shown in FIG. 7. As can be seen in the figure, the dependence of k on r/R does not vary with the surface orientation of GaAs dummy substrates, indicating that the reduced sulfur incorporation into the VPE layers growing on the (100) VPE substrate is due to the reduced growth rate on the (100) VPE substrate. Namely, GaAs VPE layers grown with the use of (111)A, (111)B, (110), or (100) GaAs dummy substrates being at the working position A have the same carrier concentrations when their growth rates are equal. Thus, it is reasonable enough to consider that the reduced sulfur incorporation into GaAs VPE layers on the (100) VPE substrates by placing the (111)A, (111)B, (110), or (100) GaAs dummy substrates just above the (100) VPE substrate is attributed to the fact that the deposition on the (111)A, (111)B, (110), or (100) GaAs dummy substrates suppresses the growth rate on the (100) VPE substrate thereby decreasing the doping efficiency of sulfur into the GaAs VPE layers on the (100) VPE substrates.

It would, therefore, be obvious from the results of the experiments above that, by differentiating the crystallographic orientation of the dummy substrate (similar to that illustrated in FIG. 7), from that of the VPE substrate, the growth rate on the VPE substrate and thus the steplike doping profile being similar to that illustrated in FIG. 3 can be obtained. A dependence phenomenon of an epitaxial growth rate on the crystallographic orientation of compound semiconductors has been investigated in a number of previous researches. The present invention utilizes such phenomenon to decrease the growth rate on a VPE substrate by differentiating the crystallographic orientation of the dummy substrate from that of the VPE substrate. The present invention can therefore be applied not only to a GaAs compound, but also to any compound semiconductor having a dependency of crystal growth rate on the crystallographic orientation. Such a dependency can be seen in the VPE growth of any compound semiconductors including the III–V group compound semiconductors and the II–VI group compound semiconductors.

The present invention is most effective for a repeatedly formed multi-layer VPE having a continuously grown buffer layer and active layer, wherein a fresh VPE substrate is inserted in a growth vessel at each growth time and then the buffer and active layers are epitaxially grown on each VPE substrate by changing the impurity concentration in the growth gases. According to the present invention, wherein the dummy substrate is located just above and opposite to the VPE substrate during the growth of the active layer, the impurity concentration of each active layer on the VPE substrate is constant and has a good reproducibility. A compound semiconductor grows also on the dummy substrate, but its crystal properties are insignificant. Advantageously, it is not necessary to replace the dummy substrate with a fresh dummy substrate but it is possible to repeatedly use the dummy substrate.

An embodiment of the repeatedly formed multi-layer VPE is explained hereinafter.

Figure 9:
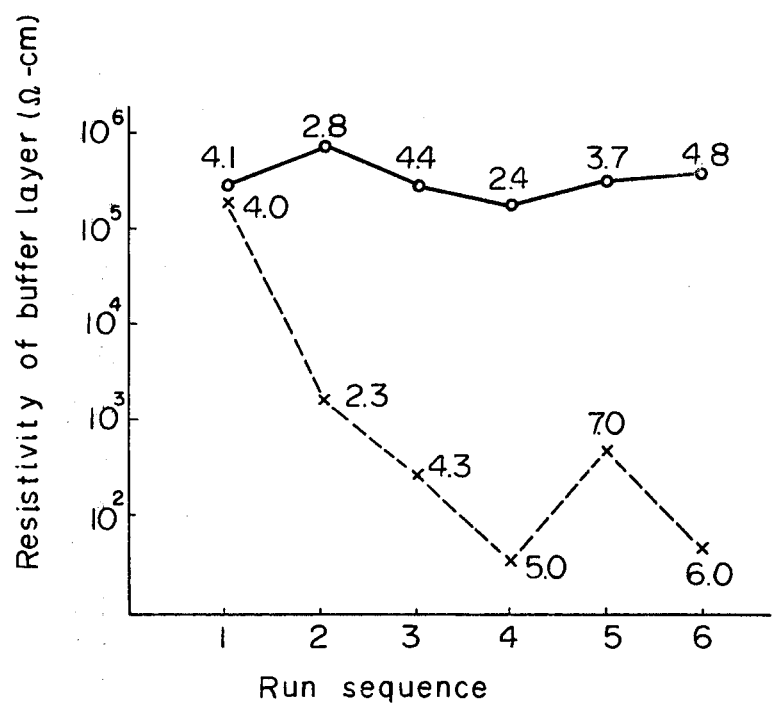
FIG. 9 illustrates a resistivity change of buffer layers formed by repeating the VPE growth.

Referring to FIG. 9, the impurity-concentration change of buffer layers formed by six successive runs of the multi-layer growth is illustrated. These buffer layers having a resistivity explained hereinbelow, and active layers, having an impurity concentration of from 1 to $2 \times 10^{17}$ cm$^{-3}$, were produced using a Ga-AsCl$_3$-N$_2$ system in accodance with a conventional method and a method of the present invention. The broken line in FIG. 9 indicates the impurity-concentration change of the buffer layers produced by a conventional method, in which no dummy substrate was arranged opposite to the (100) VPE GaAS substrate. The solid line in FIG. 9 indicates the impurity-concentration change according to a method of the present invention, in which a (111)A dummy substrate was arranged opposite to the (100) VPE GaAs substrate. As is apparent from FIG. 9, the resistivity of the buffer layers is almost constant, not withstanding the growth times in accordance with the present invention, while the resistivity decreases to a level of 1/100 times the resistivity of a first buffer layer from the second growth in accordance with the conventional method. It is, therefore, impossible to use the conventional second or later growth layer as the buffer layer. It is therefore understood that the method of the present invention greatly enhances the recovery and decreases the cost of production of semiconductor devices, as compared with the conventional methods.

Utilizing the effects illustrated in FIGS. 2–7, a method of controlling doping profiles of GaAs VPE layers has been developed. With this method, VPE layers having an extremely high coefficient of doping profile are obtained. The steepness of the doping profile is remarkably improved over the prior art and typical widths of the interface region where the carrier concentration drops from $1 \times 10^{16}$ to $1 \times 10^{15}$ cm$^{-3}$ are less than 1000 Å. Considering the effect of the carrier diffusion and the effect of the Debye length on the C-V measurements, the obtained profile suggests that the impurity concentration changes at the interface between GaAs VPE layers extremely abruptly. Such a doping profile having an extremely high coefficient, as illustrated in FIG. 3, can be obtained by a method wherein the vapor phase growth on a VPE substrate is conducted while another crystalline substrate (a dummy substrate) is positioned just above and opposite to the VPE substrate, and, further the dummy substrate is moved during the crystal growth in the gas flow direction to a downstream position B. Under a growth condition at the working position A of the dummy substrate, the impurity concentration of the layer growing on the VPE substrate can be suppressed to an extremely low level and thus the doping profile mentioned above can be obtained, although a ahigh concentration of the impurities may remain in the growth gas. Subsequent to the growth of the buffer layer or a low concentration layer at the working position A of the dummy substrate, a doping gas for the growth of the active layer or high concentration layer is introduced into the reaction tube. The growth at the working position A of the dummy substrate is continued from the time the doping gas, which has a high impurity concentration, is introduced in the reaction tube, until equilibrium of the doping gas is achieved. This equilibrium time period is empirically determined, depending upon the vapor growth condition, and is usually from 1 to 2 minutes. Subsequent to the growth at the working position A of the dummy substrate, the dummy substrate 5 (FIG. 1) is moved downstream in the flowing direction of the growth gas, so that the VPE substrate 3 is not covered by the dummy substrate. The dummy substrate 5 may be lifted up apart from the VPE substrate or be moved against the flow direction of the growth gas to an upstream position of the VPE substrate; however, the dummy substrate unfavorably influences the growth on the VPE substrate to a slight extent.

Figure 8:
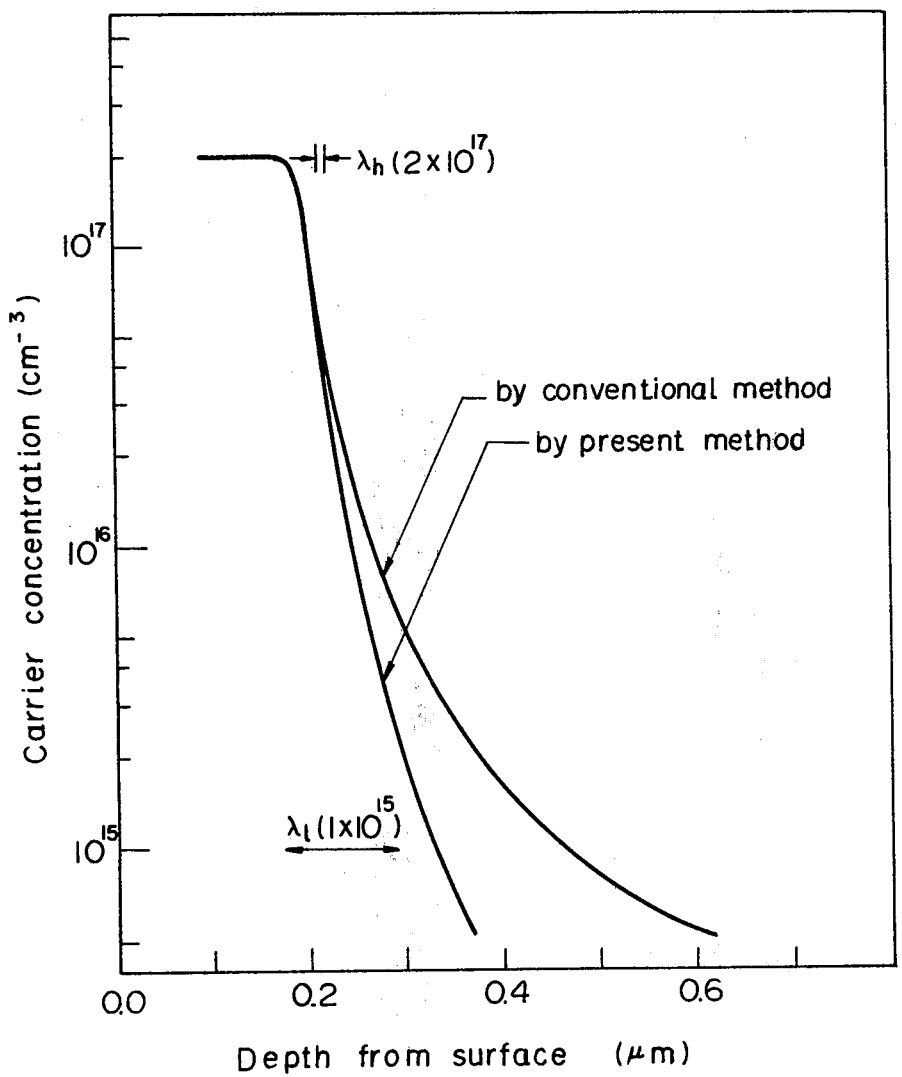
FIG. 8 illustrates a doping profile of GaAs VPE layers of MESFET and the Debye Lengths $\lambda_h$ and $\lambda_l$ of the doping levels of the active and transition layers, respectively.

Referring to FIG. 8, the carrier concentration profiles obtained by the conventional method of multi-layer VPE and by such method according to the present invention are illustrated.

The carrier concentration profile of the grown layers was measured by the Schottky-barrier differential capacitance technique (C-V method). The thickness of the grown layers was measured by C-V profiles and/or optical micrographs after cleavage and stain etching.

In the C-V profiling of the low resistivity active layer and high resistivity buffer layer, the effect of series resistance was taken into account to obtain accurate profiles and the following equation was used.

$$C_m = C/(1 + \omega^2 R^2 C^2),$$

where $C_m$ is the measured capacitance, C is the actual depletion-layer capacitance, $\omega$ is the measurement frequency, and R is the series resistance. The steepness of the doping profile is remarkably improved over the prior art and the width of the active/buffer layer interface, where the carrier concentration drops from $1 \times 10^{16}$ to $1 \times 10^{15}$ cm$^{-3}$, is less than 1000 Å. Also illustrated in FIG. 8 are the Debye lengths $\lambda_h$ and $\lambda_l$ which provide a measure of the distortion of the impurity profile, where $\lambda_h$ and $\lambda_l$ correspond to the doping levels of the active and the transition layers, respectively. Considering the effect of the carrier diffusion and the effect of the Debye length on the C-V measurements, the profile obtained by the present method suggests an extremely abrupt doping profile.

The present invention can be applied to the production of semiconductor devices as explained hereinafter.

It is necessary to form an extremely thin active/buffer layer interface for improving the microwave performance of GaAs MESFET's. The conventional method for introducing the dopant into the reaction tube, in which the dopant flow is simply turned on after the buffer layer growth is completed, resulted in a gradual increase in the carrier concentration at the interface. On the other hand, an abrupt change of the impurity concentration at the active/buffer layer interface is obtained by placing the dummy substrate at the working position A while the dopant concentration in the gas is being equilibrated, and then moving the dummy substrate to the downstream position B. The present invention can therefore improve the noise figure of the small signal FETs over that of the prior art.

In GaAs IMPATT's, the efficiency and power capabilities of the lo-hi-lo diodes are higher than those obtained with flat doping profile diodes. In the preparation of a lo-hi-lo doping profile, an extremely narrow, steep doping spike is required for high conversion efficiency and a thin avalanche layer is confined between this steep doping spike and the metal Schottky barrier. The growth of epitaxial layers having a lo-hi-lo profile has imposed very heavy demands upon the conventional epitaxial process.

Figure 10:
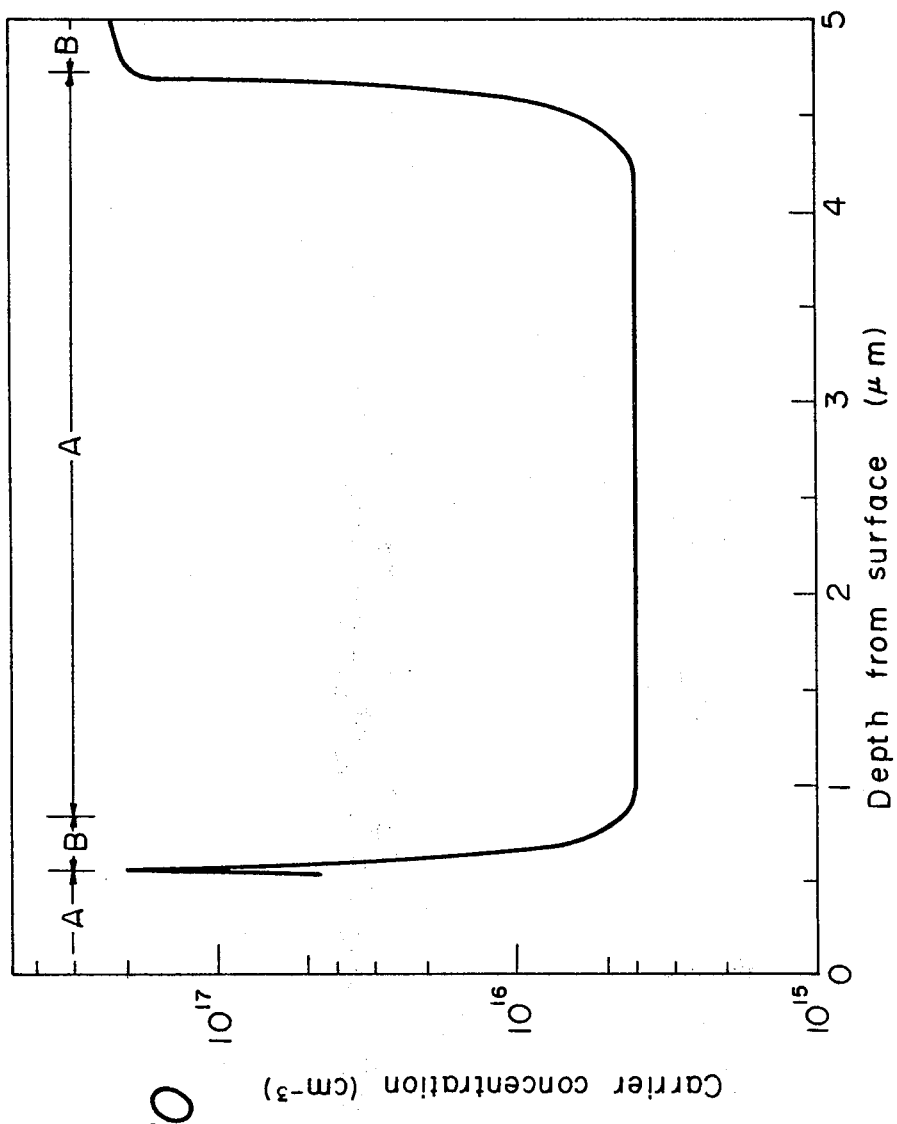
FIG. 10 illustrates a doping profile of a GaAs VPE layer grown for lo-hi-lo IMPATT diodes.

The present invention offers a very simple way to achieve the growth of epitaxial layers with a lo-hi-lo doping profile for GaAs IMPATT's. Referring to FIG. 10, a lo-hi-lo carrier concentration profile layer grown on a tellurium doped substrate in accordance with the present invention is illustrated. This profile was completed by repeating the movement of the (111)A GaAs dummy substrate from the downstream position B to the working position A two times. A narrow avalanche and drift layers were grown at the working position A of the dummy substrate, while a hi-layer was grown at the downstream position B of the dummy substrate. An extremely narrow, steep doping spike, which enhances a DC to RF conversion efficiency, can be easily obtained by the present invention.

A multi-structure layer with a periodic lo-hi doping profile can also be achieved by moving the (111)A GaAs dummy substrate downstream and upstream along the gas flow direction.

Figure 11:
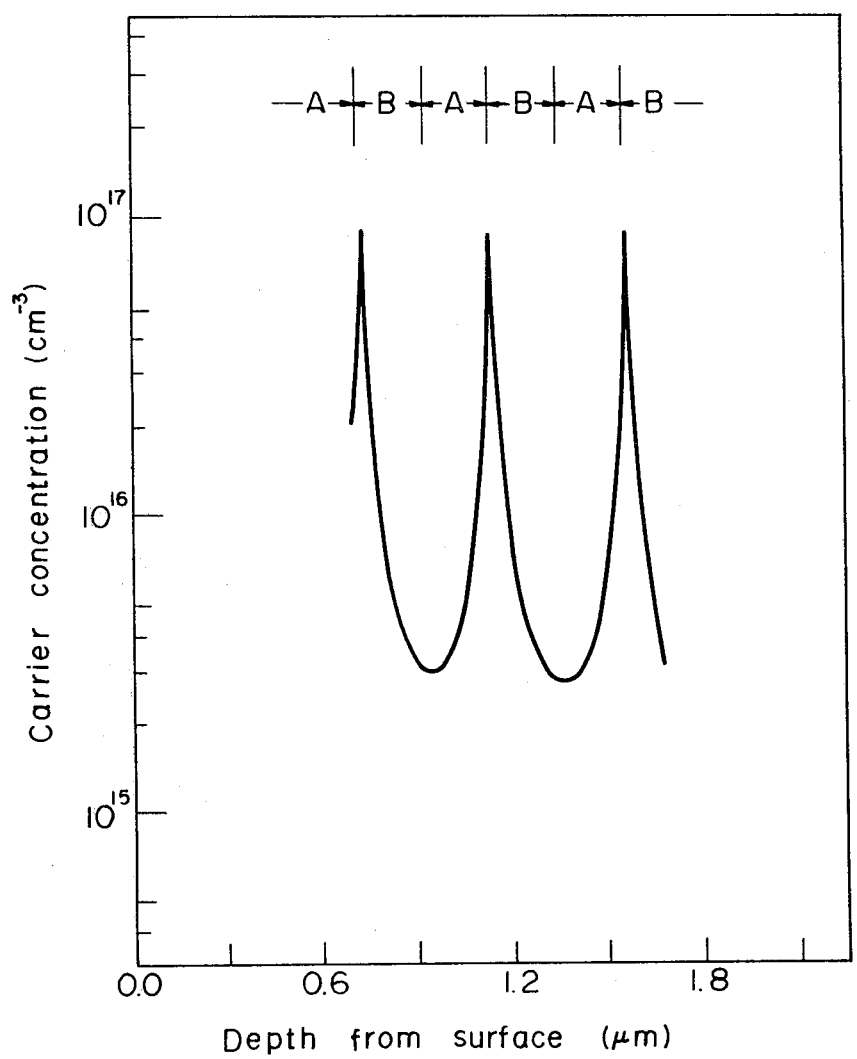
FIG. 11 illustrates a doping profile of periodic lo-hi multi-structure layers.

Referring to FIG. 11, a doping profile of a multi-structure layer which was grown by repeating the movement of the (111)A GaAs dummy substrate from the downstream position B to the working position A three times is illustrated. Only a few seconds was needed for each movement of the (111)A GaAs dummy substrate. The complete profile of the multi-structure layer was measured by a step-etching technique. The step-etching was accomplished by dipping a sample into a stirred mixture of 18:1:1 $H_2SO_4:H_2O_2:H_2O$ at room temperature. Several steps are usually needed to establish a complete profile. As shown in FIG. 11, the period of hi-layers is about 4000 Å and the width for a hi-layer at the half-peak height is about 6000 Å. The period and the width can be controlled by the holding time of the (111)A GaAs dummy substrate at the working position A and the downstream position B. It is apparent from FIG. 11 that the present invention can be used not only for the production of a semiconductor device having two layers of a high and a low impurity concentration, but also for the production of a semiconductor device having more than three layers.

I claim:

1. A vapor phase method of growing a compound semiconductor on a semiconductor crystalline substrate having a major surface comprising the steps of:
   placing in a reaction chamber said semiconductor crystalline substrate and a dummy crystalline substrate having a crystallographic orientation different from that of said semiconductor crystalline substrate; and
   establishing a reaction gas flow in said reaction chamber along the major surface of said semiconductor crystalline substrate to conduct said vapor phase growth, said dummy substrate being placed in a predetermined position opposite to and close to said semiconductor crystalline substrate during at least a part of the period of said vapor phase growth for affecting in a predetermined manner the impurity concentration of the compound semiconductor grown on said semiconductor crystalline substrate.

2. A method according to claim 1, wherein said dummy substrate is moved during the crystal growth in the gas flow direction to a downstream position.

3. A method according to claim 1 or 2, wherein not less than two layers of III-V group compound semiconductors having different impurity concentrations are grown on said semiconductor crystalline substrate and wherein said dummy substrate is positioned opposite to and close to said semiconductor crystalline substrate during the growth of a low impurity concentration layer and said dummy substrate is displaced away from said semiconductor crystalline substrate during the growth of a high impurity concentration layer.

4. A method according to claim 3, further comprising the step of moving said dummy substrate in the gas flow direction in a downstream position to grow not less than two III-V group compound semiconductor layers having different impurity concentrations on said semiconductor crystalline substrate, wherein the downstream movement of said dummy substrate is conducted when the flow of a gas for the growth of a high impurity concentration layer is stabilized in the gas phase growth reaction chamber subsequent to switching of the growth gases from a low to high impurity concentration layer.

5. A method according to claim 3, further comprising the step of moving said dummy substrate upstream against the gas flow direction to grow a low impurity concentration layer after growth of a high impurity concentration layer.

6. A method according to claim 5, further comprising the step of successively inserting a plurality of said semiconductor crystalline substrates into said gas phase growth reaction chamber so as to repeat the vapor phase growth on said semiconductor crystalline substrates using the identical dummy substrate.

7. A method according to claim 1 or 2, wherein the crystals of said semiconductor crystalline substrate and said dummy substrate are different from each other.

8. A method according to claim 1, wherein the crystals of said semiconductor crystalline substrate and said dummy substrate are of the same kind.

9. A method according to claim 8, wherein the crystals of said semiconductor crystalline substrate and said dummy substrate are GaAs.

10. A method according to claim 9, wherein the crystal of the semiconductor crystalline substrate is (100) GaAs and the crystal of the dummy substrate is (111)A GaAs.

11. A method according to claim 9, wherein the crystal of the semiconductor crystalline substrate is (100) GaAs and the crystal of the dummy substrate is (111)B GaAs.

12. A method according to claim 9, wherein the crystal of the semiconductor crystalline substrate is (110) GaAs and the crystal of the dummy substrate is (111)A GaAs.

13. A method according to claim 10, 11 or 12, wherein the crystal of the semiconductor crystalline substrate has an off angle.

14. A method according to claim 2, wherein the crystals of said semiconductor crystalline substrate and said dummy substrate are of the same kind.

15. A method according to claim 14, wherein the crystals of said semiconductor crystalline substrate and said dummy substrate are GaAs.

16. A method according to claim 15, wherein the crystal of the semiconductor crystalline substrate is (100) GaAs and the crystal of the dummy substrate is (111)A GaAs.

17. A method according to claim 15, wherein the crystal of the semiconductor crystalline substrate is (100) GaAs and the crystal of the dummy substrate is (111)B GaAs.

18. A method according to claim 15, wherein the crystal of the semiconductor crystalline substrate is (110) GaAs and the crystal of the dummy substrate is (111)A GaAs.

19. A method according to claim 16, 17 or 18, wherein the crystal of the semiconductor crystalline substrate has an off angle.

20. A method according to claim 16, 17 or 18, wherein the plane index of said dummy substrate has not more than a 5° deviation from the Miller index of said dummy substrate.

* * * * *

UNITED STATES PATENT AND TRADEMARK OFFICE
CERTIFICATE OF CORRECTION

PATENT NO. : 4,411,729

DATED : Oct. 25, 1983

INVENTOR(S) : Komeno

It is certified that error appears in the above-identified patent and that said Letters Patent is hereby corrected as shown below:

```
Front page, [56] References Cited, "Sussman" should be
     --Sussmann--;
     [57] ABSTRACT, line 5, after "A" insert --dummy--;
     line 14, after "doping" insert --profile--.
Column 1, line 62, "a" should be --the--;
Column 1, line 62, "the low" should be --a high--;
Column 1, line 65, "tenth" should be --tenths--.
Column 4, line 27, "formed" should be at left margin;
Column 4, line 27, "layer" should be at left margin; "and;"
     should be --and--.
Column 5, line 36, delete "positioned";
Column 5, line 36, after "substrate" insert --positioned--.
Column 7, line 7, delete "(similar to";
Column 7, line 8, delete "that illustrated in Fig. 7),";
Column 7, line 9, change "strate," to --strate (similar to
     that illustrated in Fig. 7),--.
Column 8, line 29, "ahigh" should be --high--.
Column 10, line 7, "6000" should be --600--.
```

Signed and Sealed this

Twelfth Day of June 1984

[SEAL]

Attest:

GERALD J. MOSSINGHOFF

Attesting Officer      Commissioner of Patents and Trademarks